(12) United States Patent
Suzuya

(10) Patent No.: US 7,397,132 B2
(45) Date of Patent: Jul. 8, 2008

(54) SEMICONDUCTOR DEVICE

(75) Inventor: Nobuhito Suzuya, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/373,142

(22) Filed: Mar. 13, 2006

(65) Prior Publication Data

US 2006/0202350 A1 Sep. 14, 2006

(30) Foreign Application Priority Data

Mar. 14, 2005 (JP) .......................... P2005-070316

(51) Int. Cl.
*H01L 23/48* (2006.01)
(52) U.S. Cl. .................. 257/777; 257/685; 257/723; 257/778; 257/787; 257/E21.503; 257/E21.511
(58) Field of Classification Search ................ 257/777, 257/778, E21.503, E21.511, 685, 723, 787, 257/E25.006, E25.013, E25.018, E25.027, 257/E25.085, E21.614; 438/106–110
See application file for complete search history.

(56) References Cited

U.S. PATENT DOCUMENTS

| 6,388,333 | B1 | 5/2002 | Taniguchi et al. | |
|---|---|---|---|---|
| 6,489,687 | B1 | 12/2002 | Hashimoto | |
| 6,528,348 | B2 | 3/2003 | Ando et al. | |
| 6,674,172 | B2 * | 1/2004 | Vincent | 257/777 |
| 6,936,930 | B2 * | 8/2005 | Wang | 257/778 |
| 7,129,573 | B2 * | 10/2006 | Hiatt et al. | 257/690 |
| 2002/0030261 | A1 * | 3/2002 | Rolda et al. | 257/685 |

FOREIGN PATENT DOCUMENTS

| JP | 2001-223297 | 8/2001 |
|---|---|---|
| JP | 2004-015068 | 1/2004 |
| JP | 2004-023045 | 1/2004 |
| WO | WO 01/26155 A1 | 12/2001 |

* cited by examiner

*Primary Examiner*—Jasmine J Clark
(74) *Attorney, Agent, or Firm*—Finnegan, Henderson, Farabow, Garrett & Dunner, L.L.P.

(57) ABSTRACT

Disclosed is a semiconductor device including an organic material substrate, a semiconductor chip flip chip connected to substantially a center of one surface of the organic material substrate, and a semiconductor package mounted on another surface of the organic material substrate in a manner to avoid a position opposing to the flip chip connected semiconductor chip. Additionally, disclosed is a semiconductor device including an organic material substrate, a semiconductor chip flip chip connected to substantially a center of one surface of the organic material substrate, and a semiconductor package having a connection terminal and mounted on another surface of the organic material substrate via the connection terminal in a manner that an overlap with the flip chip connected semiconductor chip occurs, at least a part of the connection terminal in the overlap being a dummy terminal not used for transmission of an electric signal.

13 Claims, 3 Drawing Sheets

SEMICONDUCTOR DEVICE

CROSS-REFERENCE TO RELATED APPLICATIONS

This application is based upon and claims the benefit of priority from the prior Japanese Patent Application No. 2005-70316, filed on Mar. 14, 2005; the entire contents of which are incorporated herein by reference.

BACKGROUND

1. Field of the Invention

The present invention relates to a semiconductor device having an organic material substrate as a member, and particularly to a semiconductor device on both sides of whose organic material substrate a semiconductor chip and a semiconductor package are respectively mounted.

2. Description of the Related Art

As one aspect of a semiconductor device (semiconductor package), there is a semiconductor device using a substrate of an organic material such as a glass epoxy resin as a substrate of a package, to almost a center of one surface of which a semiconductor chip is flip chip connected while on the other surface of which another semiconductor package such as a LGA (land grid array) is secondarily mounted. Such an aspect is one of semiconductor packages called Package-on-Package (PoP).

A solder joint portion of the substrate surface on which the other semiconductor package is secondarily mounted is called a secondary mounting portion. In the PoP, reliability of the secondary mounting portion depends on many elements such as, and a cross relationship of: a standoff, size, material, and thickness of the secondarily mounted package; presence/absence of an underfill resin under the secondarily mounted package, and a material thereof; a material, size, thickness of a substrate of the PoP side; and size, position, thickness and the like of a semiconductor chip which is flip chip mounted on the one surface of the substrate.

The reliability of the secondary mounting portion is generally enhanced by providing the underfill resin between the secondarily mounted package and the substrate of the PoP side under the secondarily mounted package. Also, connecting the secondarily mounted package and the PoP side substrate via a solder ball is generally effective in enhancing the reliability. It is because stress occurring to the secondary mounting portion becomes small by the solder being provided therein so that the standoff of the secondarily mounted package becomes large. However, in the former, addition of the underfill resin leads to an increase in process steps and a high cost, and in the latter, due to an increase in a height as a PoP package, there is a problem when a thin package is required in such a case of application to a cellular phone and the like.

Incidentally, as examples of the PoP, there are semiconductor devices disclosed in Japanese Patent Laid-open Application No. 2004-15068 and in International Publication No. WO 01/026155 pamphlet, though constitutions thereof are different from that of the semiconductor device according to the present invention.

[Patent Document 1] Japanese Patent Laid-open Application No. 2004-15068

[Patent Document 2] International Publication No. WO 01/026155 pamphlet

SUMMARY

A semiconductor device according to one aspect of the present invention includes an organic material substrate, a semiconductor chip flip chip connected to almost a center of one surface of the organic material substrate, and a semiconductor package mounted on another surface of the organic material substrate in a manner to avoid a position opposing to the flip chip connected semiconductor chip.

A semiconductor device according to another aspect of the present invention includes an organic material substrate, a semiconductor chip flip chip connected to almost a center of one surface of the organic material substrate, and a semiconductor package having a connection terminal and mounted on another surface of the organic material substrate via the connection terminal in a manner that an overlap with the flip chip connected semiconductor chip occurs, at least a part of the connection terminal in the overlap being a dummy terminal which is not used for transmission of an electric signal.

DETAILED DESCRIPTION (Description of the Embodiments)

Figure 1A:
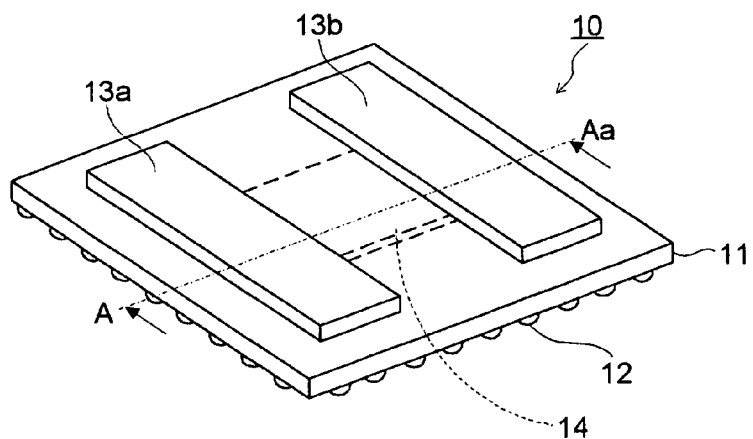
FIG. 1A and FIG. 1B are perspective views schematically showing a configuration of a semiconductor device according to an embodiment of the present invention.

Embodiment of the present invention will be described with reference to the drawings, but these drawings are provided only for an illustrative purpose, and in no way limit the invention.

In a semiconductor device according to one aspect of the present invention, a semiconductor package is mounted in a manner to avoid an opposite side (direct rear) of a region in which a semiconductor chip is flip chip mounted of an organic material substrate. A deformation of the organic material substrate due to heat in the region in which the semiconductor chip is flip chip mounted is restricted by relatively small thermal expansion of the silicon semiconductor chip, and has an aspect different from that of other regions. Thus, instead of the semiconductor package being secondarily mounted in a manner to stride over the opposite side (direct rear) of the region in which the semiconductor chip is flip chip mounted and a region in which the semiconductor chip is not mounted, the semiconductor package is secondarily mounted in a manner to avoid the opposite side (direct rear) of the region in which the semiconductor chip is flip chip mounted. Hereby, occurrence of stress in a secondary mounting portion can be suppressed. Therefore, reliability of secondary mounting can be enhanced in a PoP semiconductor device.

In a semiconductor device according to another aspect of the present invention, though a semiconductor package is mounted in a manner to include an opposite side (direct rear) of a region in which a semiconductor chip is flip chip mounted of an organic material substrate, at least a part of connection terminals in the direct rear region is a dummy terminal which is not used for transmission of an electric signal. Therefore, even if connection reliability of the secondarily mounted connection terminal in the direct rear region is lowered, an electrical property is not influenced. Hence, reliability of secondary mounting can be enhanced.

As a mode of an embodiment of the present invention, it is possible that the semiconductor package is a surface mount type package such as a BGA (ball grid array), an LGA (land grid array), or a QFP (quad flat package) and that one edge of the semiconductor package is almost parallel to one edge of the flip chip connected semiconductor chip. In the LGA, a height as the semiconductor device is reduced, enabling miniaturization. In the BGA, the reliability of secondary mounting can be further enhanced. A typical surface mount package such as the QFP can become a preferred mode. By making the one edge of the secondarily mounted semiconductor package almost parallel to the one edge of the flip chip connected semiconductor chip, a layout with high area utilization efficiency in the secondary mounting becomes possible.

Additionally, as a mode, it is possible that the semiconductor package is plural. For example, two, four, or the like can be possible. It is also possible that a planar shape of the semiconductor package is not limited to be substantially square but also to be substantially rectangular.

Additionally, as a mode, it is possible that the semiconductor device further includes an external connection terminal provided in a peripheral region of a region in which the semiconductor chip is located of the surface to which the semiconductor chip is flip chip connected of the organic material substrate. This is one example of the region in which the external connection terminal is provided. Here, it is possible that the external connection terminal has a solder ball. It is a mode in which the solder ball required for mounting is provided in advance so that a space equivalent to a height of the flip chip connected semiconductor chip is secured at the time of mounting.

Additionally, as a mode, it is possible that the semiconductor device further includes a resin provided between the organic material substrate and the semiconductor package. Sealing with the resin can further improve the reliability of the secondary mounting.

Figure 1B:
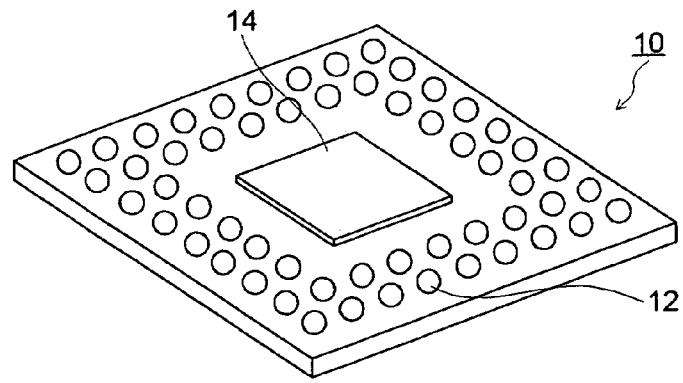

Based on the above, hereinafter embodiments of the present invention will be described with reference to the drawings. FIG. 1A and FIG. 1B are perspective views schematically showing a configuration of a semiconductor device according to one embodiment of the present invention. FIG. 1B shows an opposite side surface of the semiconductor device of FIG. 1A.

As shown in FIG. 1A, this semiconductor device includes a glass epoxy resin wiring board 11 being an organic material substrate, one of whose surfaces is a surface on which semiconductor packages 13a, 13b are secondarily mounted (secondary mounting surface). As for an opposite side of the this surface, to around a center thereof, a semiconductor chip 14 is flip chip connected, and an outer peripheral region of the flip chip connected semiconductor chip 14 is an external connection terminal with a solder ball 12. The secondarily mounted semiconductor packages 13a, 13b are LGA packages, which are mounted on the secondary mounting surface by a connecting solder made by reflowing a cream solder. In this embodiment, as described above, a mounting on the opposite side surface of the surface having the flip chip connected semiconductor chip 14 of the wiring board 11 is referred to as "secondary mounting".

A positional relationship between the secondarily mounted semiconductor packages 13a, 13b and the flip chip connected semiconductor chip 14 is such that they do not overlap each other. This is because a thermal deformation of the wiring board 11 in the region in which the semiconductor chip 14 is mounted differs from that in the other region and reliability of secondary mounting is reduced if the secondarily mounted semiconductor packages 13a, 13b are mounted in a manner to stride over those regions, as described later.

Incidentally, FIG. 1A and FIG. 1B are illustrated schematically, and in reality, the numbers of terminals of the secondarily mounted semiconductor packages 13a, 13b are, for example, 113 respectively and the number of the solder balls 12 being the external connection terminal is, for example, 300.

Figure 2:
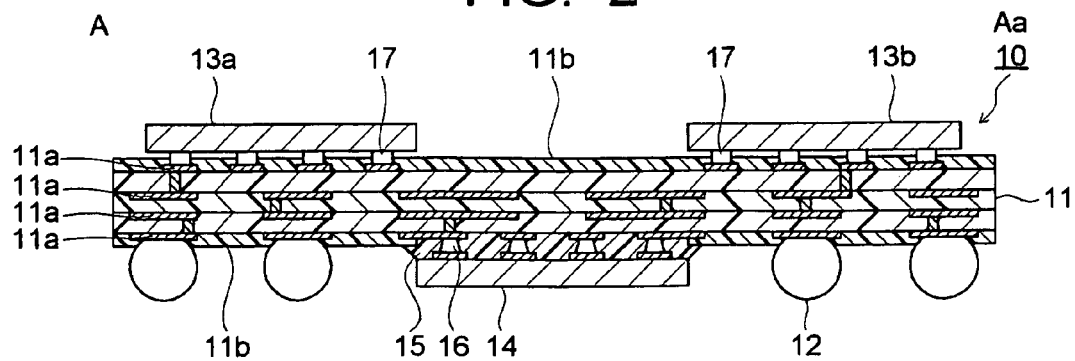
FIG. 2 is a cross-sectional view of the semiconductor device shown in FIG. 1A taken along a line A-Aa as seen in an arrow direction.

FIG. 2 is a cross-sectional view of the semiconductor device shown in FIG. 1A taken along a line A-Aa as seen in an arrow direction. In FIG. 2, the same reference numerals and symbols are used to designate the same portions as those shown in FIG. 1A and FIG. 1B. In this embodiment, the wiring board 11 includes four layers of wiring patterns 11a in total, and in necessary regions of both upper and lower surfaces thereof, patterns of solder resists 11b are formed. The wiring patterns 11a are electrically conducted to each other through a vertical electric conductor in a necessary position. A part of the most outer layer of the wiring patterns 11a includes a land for flip chip connecting the semiconductor chip 14 and for secondarily mounting the semiconductor packages 13a, 13b.

The semiconductor chip 14 is flip chip connected to the land by the most outer layer wiring pattern 11a of the wiring board 11, by a connecting bump 16 provided on a pad the semiconductor chip 14 has. Between the semiconductor chip 14 and the wiring board 11 an underfill resin 15 is filled to enhance reliability of connection. On the other hand, as already described, the secondarily mounted semiconductor packages 13a, 13b are mounted on the wiring board 11 using a connecting solder 17 made by reflowing a cream solder.

Figure 3A:
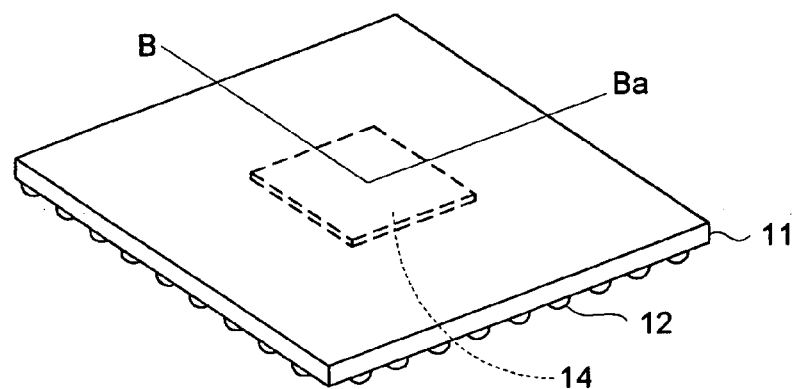
FIG. 3A and FIG. 3B are drawings schematically illustrating an aspect of a thermal deformation of the semiconductor device shown in FIG. 1A and FIG. 1B.
Figure 3B:
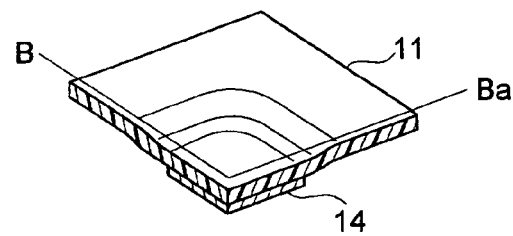

FIG. 3A and FIG. 3B are drawings schematically illustrating an aspect of a thermal deformation of the semiconductor device shown in FIG. 1A and FIG. 1B. In FIG. 3A and FIG. 3B, though the same numerals and symbols are used to designate the portions already described, depiction of the secondarily mounted semiconductor packages 13a, 13b is omitted for the sake of convenience in explanation. FIG. 3B is a drawing showing a one fourth part indicated by a line B-Ba in FIG. 3A by hypothetically cutting out the part.

As shown in FIG. 3B, it is found that the deformations due to heat are different between in the region where the semiconductor chip 14 is connected and in its surrounding region (according to a result of numerical analysis). That is, the wiring board 11 is deformed in a manner that a rear side of the region in which the semiconductor chip 14 exists is depressed. It is considered that a reason why such a deformation occurs is that, as the wiring board 11 being the organic material is easier to be thermally expanded than the semiconductor chip 14 being a silicon, the deformation of the wiring board 11 is restricted in the region in which the semiconductor chip 14 is mounted due to a firm connection with the semiconductor chip 14.

Since such a deformation occurs, when the secondarily mounted semiconductor packages 13a, 13b are mounted in a manner to stride over a direct rear of the semiconductor chip 14 and a region other than the direct rear, a large stress occurs in a vertical direction to the connecting solder 17 in the secondary connecting portion, due to a heat cycle. Such a stress in the vertical direction does not occur when the semiconductor package is mounted on the wiring board ordinarily. (Incidentally, it is known that in such an ordinary mounting, a larger stress occurs to an outer terminal (typically, terminals of four corners) of the semiconductor package, causing to reduce the reliability. However, the stress in this case is generally in a lateral direction (shearing direction).)

In order to reduce new occurrence of the vertical stress described above, it is effective to mount the secondarily mounted semiconductor packages 13a, 13b in the manner to avoid the direct rear of the semiconductor chip 14, as shown in FIG. 1A, FIG. 1B and FIG. 2. Mounting in such a manner means that the semiconductor packages 13a, 13b are mounted in a region in which a level difference generated is small. As a consequence, it may become possible that even in a mannar in which the underfill resin is not filled between the semiconductor packages 13a, 13b and the wiring board 11, required reliability can be secured. By simplifying a process, cost can be reduced. Further, though the mounting of the secondarily mounted packages 13a, 13b via a solder ball generally enhances reliability, it may become possible that the required reliability can be secured even in manners other than that. Making a thinner PoP semiconductor package can be performed, which is suitable for an application to devices requiring miniaturization such as a cellular phone.

It is possible that the semiconductor packages 13a, 13b are semiconductors of a surface mount type such as QFP, in addition to the LGA. It is possible that the number to be mounted is one or more as necessary. As for an arrangement of the secondary mounting, it is preferable in terms of design of the wiring pattern on the wiring board 11 that edges of the semiconductor packages 13a, 13b are almost parallel to an edge of the flip chip connected semiconductor chip 14 as shown in FIG. 1A, but the arrangement is not restricted thereto.

Figure 4:
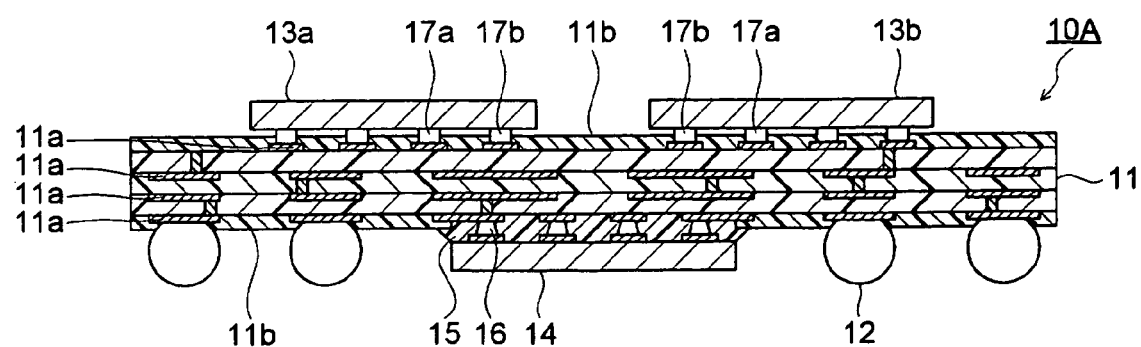
FIG. 4 is a cross-sectional view schematically showing a configuration of a semiconductor device according to another embodiment of the present invention.

Next, a semiconductor device according to another embodiment of the present invention will be described with reference to FIG. 4. FIG. 4 is a cross-sectional view schematically showing a configuration of the semiconductor device according to another embodiment of the present invention. In FIG. 4, the same reference numerals and symbols will be used to designate the same or similar components as those in the drawings already described. Description thereof will be refrained.

As for a semiconductor device 10A of this embodiment, secondarily mounted semiconductor packages 13a, 13b are mounted in a manner that parts thereof overlap a direct rear of a semiconductor chip 14 as shown in the drawing. This embodiment differs from the above embodiment in this regard. As already explained, in such a manner, connection reliability of parts of connecting solders 17a, 17b in a secondary mounting portion is reduced. Thus, in this embodiment, at least a part of the connecting solders located in the direct rear of the semiconductor chip 14, such as the connecting solders 17b, is for a dummy terminal which is not used for transmission of an electric signal. Hereby, reliability in the electrical meaning is sought to be secured.

Figure 5:
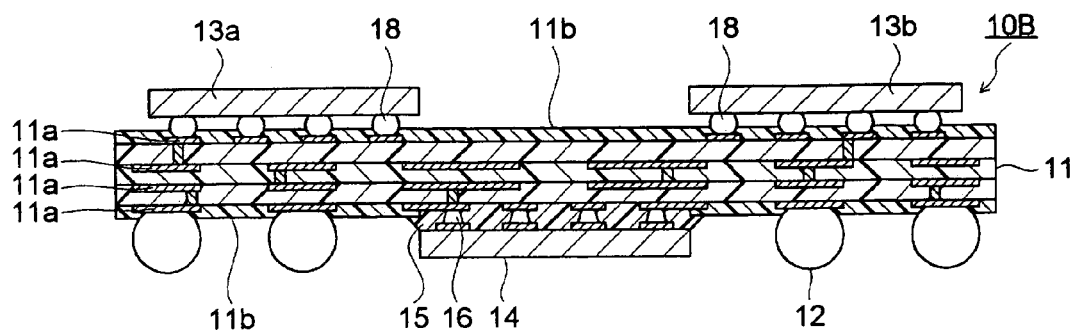
FIG. 5 is a cross-sectional view schematically showing a configuration of a semiconductor device according to still another embodiment of the present invention.

Next, a semiconductor device according to still another embodiment of the present invention will be described with reference to FIG. 5. FIG. 5 is a cross-sectional view schematically showing a configuration of the semiconductor device according to still another embodiment of the present invention. In FIG. 5, the same reference numerals and symbols will be used to designate the same or similar components as those in the drawings already described. Description thereof will be refrained.

A semiconductor device 10B of this embodiment is different from the embodiment shown in FIG. 1A, FIG. 1B and FIG. 2 in that a mounting of a secondarily mounted packages 13a, 13b is performed via a solder ball 18. In the mounting via the solder ball 18, a stress occurring to a connecting portion thereof is alleviated per unit volume both in a vertical direction and in a lateral direction, compared with the connection by simply reflowing the cream solder. Therefore, it is possible that the reliability of the semiconductor device is further enhanced.

Figure 6:
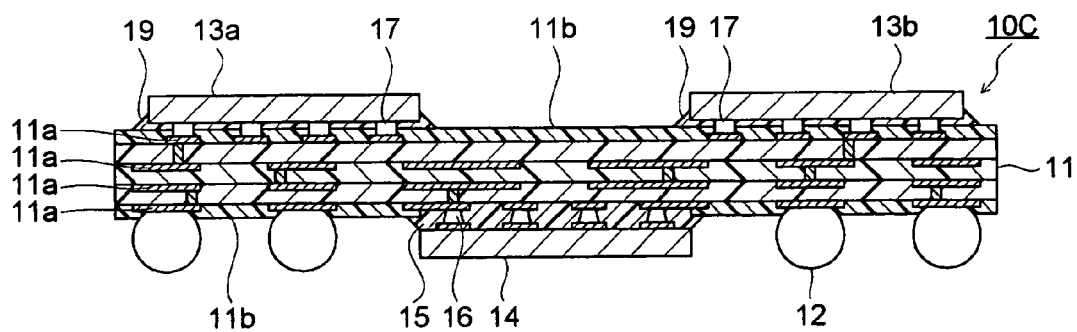
FIG. 6 is a cross-sectional view schematically showing a configuration of a semiconductor device according to yet another embodiment of the present invention.

Next, a semiconductor device according to yet another embodiment of the present invention will be described with reference to FIG. 6. FIG. 6 is a cross-sectional view schematically showing a configuration of the semiconductor device according to yet another embodiment of the present invention. In FIG. 6, the same reference numerals and symbols will be used to designate the same or similar components as those in the drawings already described. Description thereof will be refrained.

A semiconductor device 10C of this embodiment is different from the embodiment shown in FIG. 1A, FIG. 1B and FIG. 2 in that, in a mounting portion of secondarily mounted packages 13a, 13b, an underfill resin 19 is provided between a wiring board 11 and the secondarily mounted packages 13a, 13b. By a connecting solder 17 being shut off from air by the underfill resin 19, protection from the environment is enhanced and possibility of reduced reliability due to a transmutation can be decreased. Therefore, it is possible that the reliability of the semiconductor device is further enhanced. Incidentally, application of the underfill resin 19 can be adopted in the embodiment shown in FIG. 5 to further improve the reliability.

It should be understood that the present invention is not limited to the specific embodiments described above with illustration and all the changes which come within the range of equivalency of the following claims are therefore intended to be embraced therein.

What is claimed is:

1. A semiconductor device, comprising:
   an organic material substrate;
   a semiconductor chip flip chip connected to substantially a center of one surface of the organic material substrate;
   a first resin provided between the organic material substrate and the semiconductor chip;
   a semiconductor package mounted on another surface of the organic material substrate in a manner to avoid a position opposing to the flip chip connected semiconductor chip; and
   an external connection terminal with a land provided on a region of the one surface of the organic material substrate, the region being located apart from a region the semiconductor chip is positioned in.

2. The semiconductor device as set forth in claim 1, wherein the semiconductor package is a surface mount type package.

3. The semiconductor device as set forth in claim 2, wherein the semiconductor package is a BGA, LGA, or QFP, and one edge of the semiconductor package is substantially parallel to one edge of the flip chip connected semiconductor chip.

4. The semiconductor device as set forth in claim 1, wherein the semiconductor package is plural.

5. The semiconductor device as set forth in claim 1, further comprising a second resin provided between the organic material substrate and the semiconductor package.

6. The semiconductor device as set forth in claim 1, wherein the external connection terminal has a solder ball.

7. A semiconductor device, comprising:
an organic material substrate;
a semiconductor chip flip chip connected to substantially a center of one surface of the organic material substrate; and
a semiconductor package having a connection terminal and mounted on another surface of the organic material substrate via the connection terminal in a manner that an overlap with the flip chip connected semiconductor chip occurs, at least a part of the connection terminal in the overlap being a dummy terminal not used for transmission of an electric signal.

8. The semiconductor device as set forth in claim 7, wherein the semiconductor package is a surface mount type package.

9. The semiconductor device as set forth in claim 8, wherein the semiconductor package is a BGA, LGA, or QFP, and one edge of the semiconductor package is substantially parallel to one edge of the flip chip connected semiconductor chip.

10. The semiconductor device as set forth in claim 7, wherein the semiconductor package is plural.

11. The semiconductor device as set forth in claim 7, further comprising a resin provided between the organic material substrate and the semiconductor package.

12. The semiconductor device as set forth in claim 7, further comprising an external connection terminal provided in a region of the one surface of the organic material substrate the semiconductor is flip chip connected to, the region is peripheral from a region the semiconductor chip is located in.

13. The semiconductor device as set forth in claim 12, wherein the external connection terminal has a solder ball.

* * * * *